United States Patent
Moon et al.

(10) Patent No.: US 6,777,985 B2
(45) Date of Patent: Aug. 17, 2004

(54) INPUT/OUTPUT BUFFER HAVING REDUCED SKEW AND METHODS OF OPERATION

(75) Inventors: Byong-mo Moon, Seoul (KR); Jin-hyung Cho, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/431,980

(22) Filed: May 8, 2003

(65) Prior Publication Data

US 2003/0210079 A1 Nov. 13, 2003

(30) Foreign Application Priority Data

May 9, 2002 (KR) .................................... 2002-0025625

(51) Int. Cl.[7] ............................ H03K 5/153; H03K 5/22
(52) U.S. Cl. ............................. 327/77; 327/88; 327/89
(58) Field of Search ............................. 327/78–81, 72, 327/73, 77, 85, 88, 89, 561–563

(56) References Cited

U.S. PATENT DOCUMENTS 5,929,679 A * 7/1999 Ohwada ..................... 327/206
6,614,270 B2 * 9/2003 Okamoto et al. ............. 327/77

* cited by examiner

*Primary Examiner*—Tuan T. Lam
(74) *Attorney, Agent, or Firm*—Myers Bigel Sibley & Sajovec

(57) ABSTRACT

A buffer has an amplifier that receives an external signal, a reference voltage, and outputs an amplified signal. The amplified signal is responsive to the difference between the external signal and the reference voltage. An inverter receives the amplified signal and generates an inverted signal. A voltage supply circuit is configured to provide an adjusted power supply voltage to the inverter responsive to the reference voltage. A ground voltage supply circuit is configured to provide an adjusted ground voltage to the inverter responsive to the reference voltage.

34 Claims, 4 Drawing Sheets

INPUT/OUTPUT BUFFER HAVING REDUCED SKEW AND METHODS OF OPERATION

RELATED APPLICATION

This application claims the benefit of Korean Patent Application No. 2002-25625, filed May 9, 2002, the disclosure of which is hereby incorporated herein by reference in its entirety as if set forth fully herein.

1. Field of the Invention

The present invention relates to input/output buffers, and more particularly, to differential type input/output buffers and related methods.

2. Description of the Related Art

A semiconductor memory device typically includes various circuits. One such circuit is an input/output buffer. FIG. 1 is a block diagram of a conventional differential type input/output buffer. Referring to FIG. 1, the conventional differential type input/output buffer comprises a differential amplification portion 111 and an inverting portion 121.

A reference voltage Vref and an external signal IN are applied to the differential amplification portion 111. The external signal IN is converted into a complementary metal oxide semiconductor (CMOS) level voltage by the differential amplification portion 111, inverted by the inverting portion 121, and output as Vout.

The reference voltage Vref applied to the differential amplification portion 111 may vary as a result of external factors, for example noise. As a result, the common mode of the differential amplification portion 111 can vary. If the common mode of the differential amplification portion 111 varies, a relatively large amount of skew 221 and 231 may occur in the output signal Vout of the inverting portion 111 as shown in FIG. 2.

In other words, if the reference voltage Vref increases above a reference value, for example, 1.25 volts, the rising time of the output signal of the differential amplification portion 111 may become slow and the falling time of the output signal may become fast. Accordingly, the falling time of the output signal Vout of the inverting portion 121 may become slower (222) than the reference signal 211, and the rising time of the output signal may become faster (221) than the reference signal 211.

On the other hand, if the reference voltage Vref decreases below the reference value, the rising time of the output signal of the differential amplification portion 111 may become fast and the falling time of the output signal may become slow. Accordingly, the falling time of the output signal Vout of the inverting portion 121 may become faster (232) than that of the reference signal 211, and the rising time of the output signal may become slower (231) than that of the reference signal 211. Accordingly, a large amount of skew may occur in the output signal Vout of the inverting portion 121 as shown in FIG. 2.

As described above, a large amount of skew may occur in the output signal Vout of the inverting portion 121 as the reference voltage Vref applied to the amplifier 111 is changed. Semiconductor devices equipped with the input/output buffer can malfunction due to skew.

SUMMARY OF THE INVENTION

According to embodiments of the present invention, a buffer may have an amplifier that receives an external signal, a reference voltage, and outputs an amplified signal. The amplified signal is responsive to the difference between the external signal and the reference voltage. An inverter receives the amplified signal and outputs an inverted signal. A voltage supply circuit is configured to provide an adjusted power supply voltage to the inverter responsive to the reference voltage. A ground voltage supply circuit, is configured to provide an adjusted ground voltage to the inverter responsive to the reference voltage.

In this configuration, the power supply voltage and the ground voltage provided to the inverter can be adjusted responsive to the reference voltage so that if a reference voltage increases or decreases above or below the reference value, the resulting skew at the output signal of the input/output buffer may be decreased.

In other embodiments according to the invention, a method for reducing skew in a buffer includes receiving a power supply voltage, a ground voltage, and external signal and a reference voltage. An output signal is output responsive to the difference between the external signal and the reference voltage. The output signal is inverted responsive to the reference voltage.

According to certain embodiments of the invention, a differential type input/output buffer may have a differential amplification portion which receives an external signal and a reference voltage, amplifies the external signal and outputs the amplified signal. An inverting portion inverts the output of the differential amplification portion and outputs the inverted signal. A power source provides a power supply voltage to the inverting portion, and varies the quantity of electric charge provided to the inverting portion in response to the reference voltage. A ground voltage supply portion provides a ground voltage to the inverting portion, and varies the quantity of electric charge provided to the inverting portion in response to the reference voltage.

In other embodiments, a differential type input/output buffer may have a differential amplification portion which receives an external signal and a reference voltage, amplifies the external signal, and outputs the amplified signal. A pull-up portion receives the reference voltage and a power supply voltage, and outputs an output signal having the power supply voltage level in response to the reference voltage when the output signal of the differential amplification portion is logic low. A pull-down portion receives the reference voltage and a ground voltage, and outputs an output signal of the ground voltage level in response to the reference voltage when the output signal of the differential amplification portion is logic high.

In further embodiments, a differential type input/output buffer may have a differential amplification portion which receives an external signal and a reference voltage, amplifies the external signal, and outputs the amplified signal. An inverting portion inverts the output of the differential amplification portion and outputs the inverted signal. A power supply voltage supply portion receives the reference voltage, and delays the time for an output signal of the inverting portion to be transited from logic low to logic high if the reference voltage increases above a reference value when an output of the differential amplification portion is transited from logic high to logic low, and increases the time for an output signal of the inverting portion to be transited from logic low to logic high if the reference voltage decreases below the reference value.

In other embodiments, a differential type input/output buffer may have a differential amplification portion which receives an external signal and a reference voltage, amplifies the external signal, and outputs the amplified signal. An inverting portion inverts the output of the differential amplification portion and outputs the inverted signal. A power supply voltage supply portion receives the reference voltage, and increases the time for an output signal of the inverting portion to be transited from logic high to logic low if the reference voltage increases above a reference value when an output of the differential amplification portion is transited from logic low to logic high, and delays the time for an output signal of the inverting portion to be transited from logic high to logic low if the reference voltage decreases below the reference value.

DETAILED DESCRIPTION OF THE INVENTION

Figure 1:
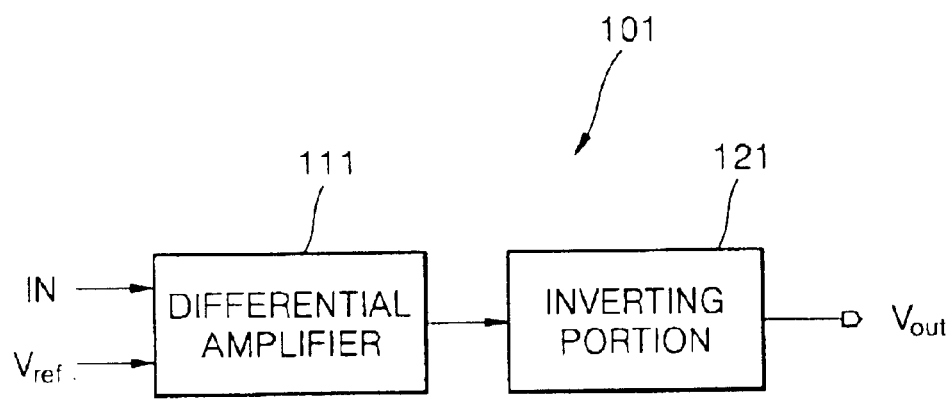
FIG. 1 is a block diagram of a conventional differential type input/output buffer.
Figure 2:
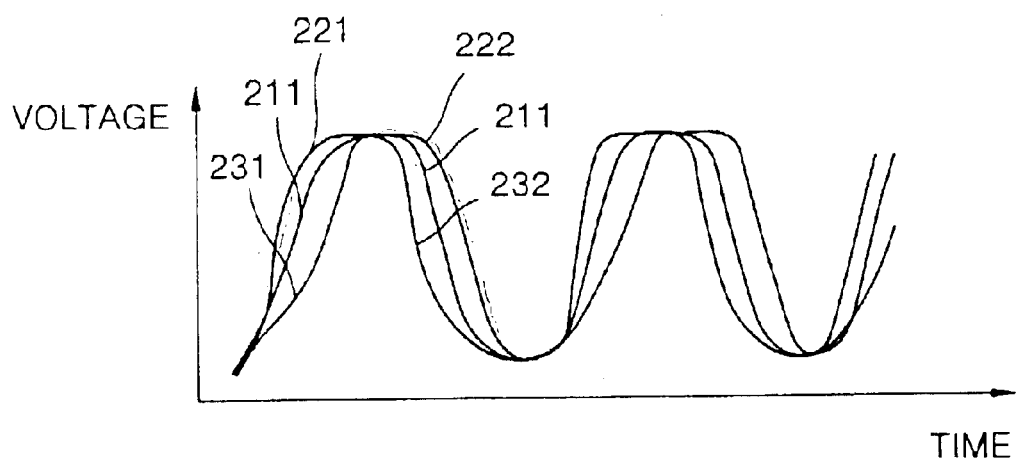
FIG. 2 is a graph of an output signal of an inverting portion and the resulting skew when the reference voltage shown in FIG. 1 is varied.

The present invention now will be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will be understood that when an element is referred to as being "coupled" or "connected" to another element, it can be directly coupled or connected to the other element or intervening elements may also be present. In contrast, when an element is referred to as being "directly coupled" or "directly connected" to another elemtn, there are no intervening elements present. Like reference numerals in the drawings denote like members.

Figure 3:
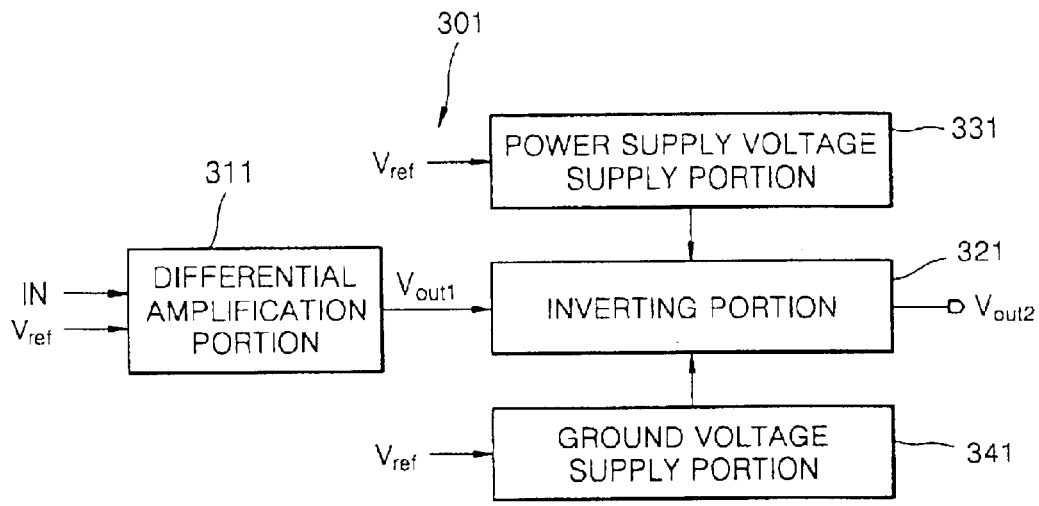
FIG. 3 is a block diagram of a buffer according to embodiments of the present invention.

FIG. 3 is a block diagram of a differential type input/output buffer according to embodiments the present invention. Referring to FIG. 3, the differential type input/output buffer 301 includes a differential amplification portion 311, an inverting portion 321, a power supply voltage supply portion 331 and a ground voltage supply portion 341.

An external signal IN and a reference voltage Vref are input to the differential amplification portion 311, and the differential amplification portion 311 amplifies the external signal IN and outputs VOUT1. That is, if the external signal IN is higher than the reference voltage Vref, the differential amplification portion 311 outputs a ground voltage Vss level signal VOUT1, and if the external signal IN is lower than the reference voltage Vref, the differential amplification portion 311 outputs a power supply voltage Vdd level signal VOUT1. For example, if the input/output buffer 301 is used as an input buffer, the external signal IN can have a voltage of a transistor transistor logic level (TTL) or a stub series terminated logic (SSTL) level. The power supply voltage Vdd may be a CMOS level voltage. Therefore, in some embodiments, an external signal IN having the TTL or SSTL level is input into the differential amplification portion 311 and is converted into a CMOS level signal and output VOUT1.

Figure 5:
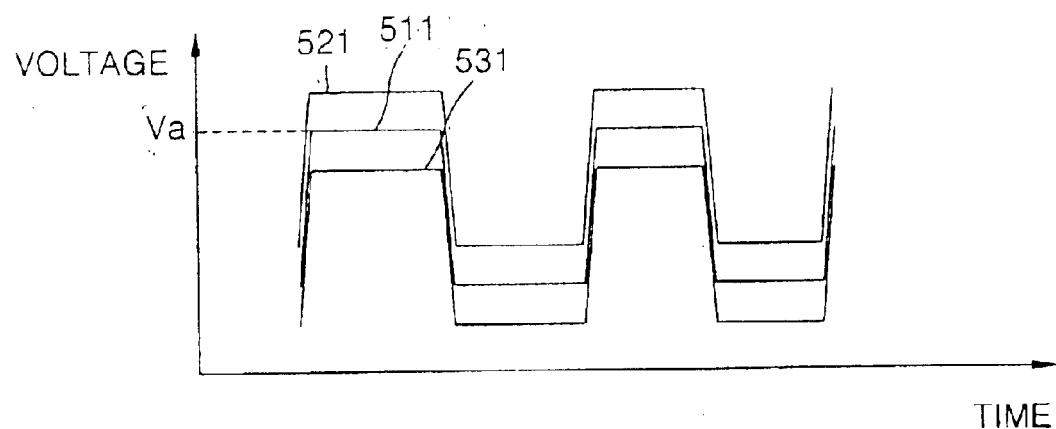
FIG. 5 is a graph illustrating the state where the reference voltage shown in FIGS. 3 and 4 is varied.
Figure 6:
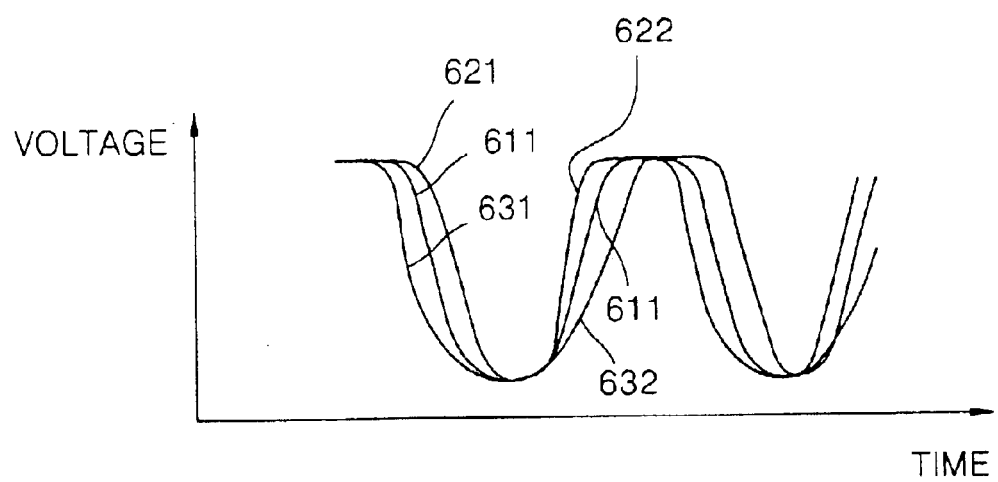
FIG. 6 is a graph of the output signal of a differential amplification portion when the reference voltage shown in FIGS. 3 and 4 is varied.

The reference signal 611 as shown in FIG. 6 is a signal output from the differential amplification portion 311 when the reference voltage Vref is equal to the reference value 511 as shown in FIG. 5. If the reference voltage Vref increases above the reference value Va, for example, 1.25 volts, the differential amplification portion 311 may output an output signal VOUT1 (631 in FIG. 6) faster than a reference signal (611 in FIG. 6). That is, the transition from logic high to logic low of the output signal VOUT1 (631 in FIG. 6) may occur sooner than the reference output signal 611, and the slope is greater. If the reference voltage Vref decreases below the reference value Va (in FIG. 5), the differential amplification portion 311 may output an output signal VOUT1 (621 in FIG. 6) slower than the reference signal (611 in FIG. 6). That is, the transition from logic high to logic low of the output signal VOUT1 (621 in FIG. 6) may occur later than the reference signal 611.

The inverting portion 321 inverts the output of the differential amplification portion 311 and outputs it as an output signal VOUT2 of the input/output buffer 301. The power source 331 supplies the power supply voltage Vdd to the inverting portion 321. The power source 331 changes the quantity of electric charge of the power supply voltage Vdd supplied to the inverting portion 321 in response to the reference voltage Vref. That is, if the reference voltage Vref increases above the reference value (Va in FIG. 5), the quantity of electric charge of the power supply voltage Vdd provided to the inverting portion 321 decreases. On the other hand, if the reference voltage Vref decreases below the reference value (Va in FIG. 5), the quantity of electric charge of the power supply voltage Vdd supplied to the inverting portion 321 increases.

The ground voltage supply portion 341 provides a ground voltage Vss to the inverting portion 321. The ground voltage supply portion 341 changes the quantity of electric charge of the ground voltage Vss provided to the inverting portion 321 in response to the reference voltage Vref. That is, if the reference voltage Vref increases above the reference value (Va in FIG. 5), the quantity of electric charge of the ground voltage Vss provided to the inverting portion 321 increases. On the other hand, if the reference voltage Vref decreases below the reference value (Va in FIG. 5), the quantity of electric charge of the ground voltage Vss provided to the inverting portion 321 decreases. In other words, if the reference voltage Vref increases above the reference value (Va in FIG. 5), the amount of the current flowing to the ground terminal increases. If the reference voltage Vref decreases below the reference value (Va in FIG. 5), the quantity of electric charge flowing to the ground terminal decreases.

Figure 4:
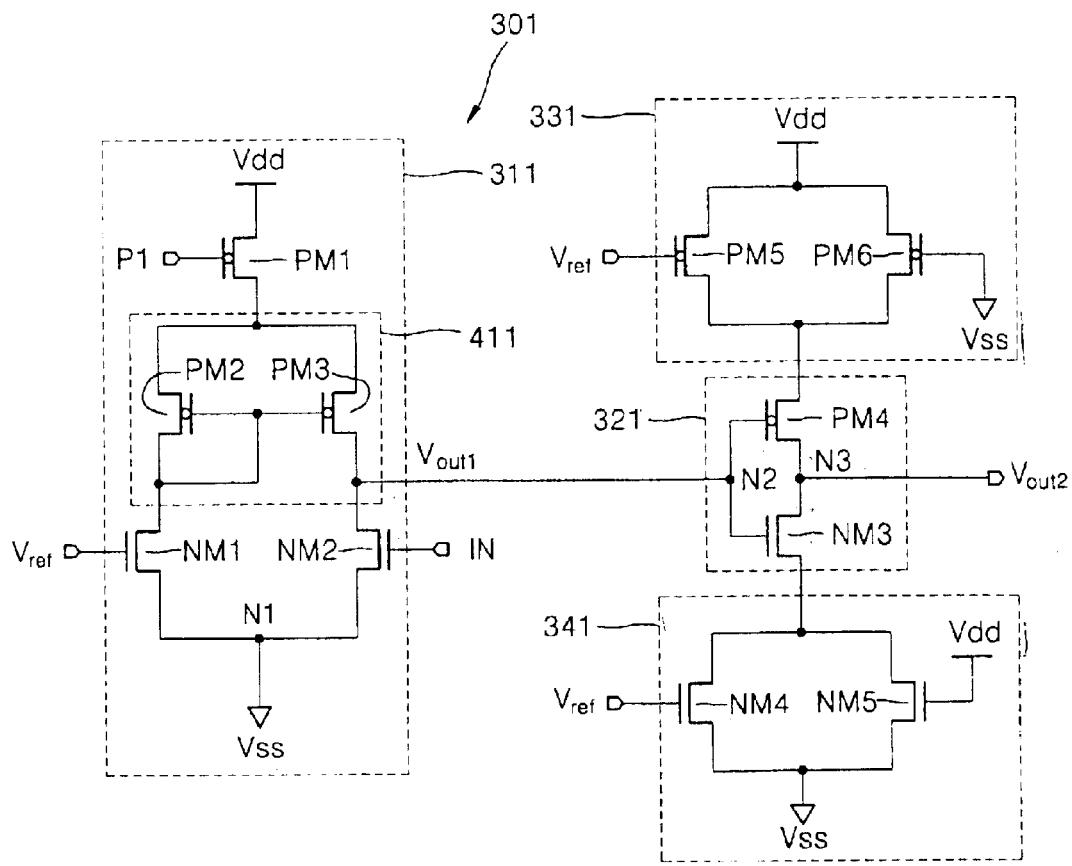
FIG. 4 is a circuit diagram of input/output buffers according to embodiments of the present invention.

FIG. 4 is a circuit diagram of the input/output buffer 301 illustrated in FIG. 3.

The differential amplification portion 311 includes NMOS transistors NM1 and NM2, a current mirror 411, and a PMOS transistor PM1. A reference voltage Vref and an external signal IN are input to NMOS transistors NM1 and NM2, respectively. When a control signal P1 input to a gate of the PMOS transistor PM1 is logic low, the PMOS transistor PM1 becomes active and provides a power supply voltage Vdd to the current mirror 411. The PMOS transistor PM1 may be omitted from the differential amplification portion 311. The differential amplification portion 311 may also include a current source (not shown) connected between the node N1 and the ground voltage Vss. The current mirror 411 includes PMOS transistors PM2 and PM3.

The inverting portion 321 includes a PMOS transistor PM4 and an NMOS transistor NM3. An output signal VOUT1 of the differential amplification portion 311, which is input to a node N2, is inverted and output-as an output signal VOUT2 of the input/output buffer 301 from a node N3.

The power supply voltage supply portion 331 includes PMOS transistors PM5 and PM6. The reference voltage Vref is applied to the gate of the PMOS transistor PM5, and the gate of the PMOS transistor PM6 is grounded. The PMOS transistor PM6 is maintained to be active. Accordingly, if the reference voltage Vref increases above the reference value (Va in FIG. 5), the gate-source voltage Vgs of the PMOS transistor PM5 decreases and the quantity of electric charge provided to the inverting portion 321 decreases. On the other hand, if the reference voltage Vref decreases below the reference value (Va in FIG. 5), the gate-source voltage Vgs of the PMOS transistor PM5 increases and the quantity of electric charge provided to the inverting portion 321 increases.

An increasing Vref results in an increasing resistance through transistor PM5 and a reducing current from Vdd to inverter 321. A decreasing Vref results in a decreasing resistance through transistor PM5 and an increasing current from Vdd to inverter 321.

The ground voltage supply portion 341 comprises NMOS transistors NM4 and NM5. A reference voltage Vref is applied to the gate of the NMOS transistor NM4, and a power supply voltage Vdd is applied to the gate of the NMOS transistor NM5. The NMOS transistor NM5 is maintained to be active. Accordingly, if the reference voltage Vref increases above the reference value (Va in FIG. 5), the gate-source voltage Vgs of the NMOS transistor NM4 increases, and the quantity of electric charge flowing from the inverting portion 321 to the ground terminal increases. On the other hand, if the reference voltage Vref decreases below the reference value (Va in FIG. 5), the gate-source voltage Vgs of the NMOS transistor NM4 decreases and the quantity of electric charge flowing from the inverting portion 321 to the ground terminal decreases. FIG. 5 shows the reference voltabe Vref (521) increasing above the reference value Va and the reference voltage Vref (531) decreasing below the reference value Va. Referring to FIG. 5, the reference value is not constant but varies.

An increasing Vref results in a decreasing resistance through transistor NM4 and an increasing current from inverter 321 to ground. A decreasing Vref results in an increasing resistance through transistor NM4 and a decreasing current from inverter 321 to ground.

Figure 7:
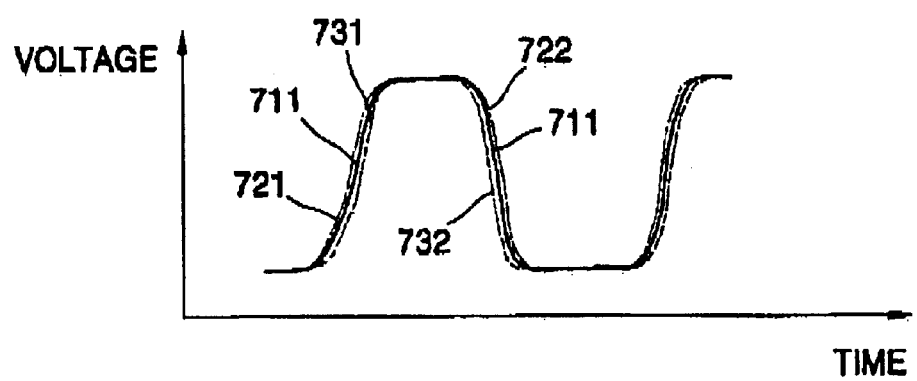
FIG. 7 is graph of the output signal of the buffer shown in FIGS. 3 and 4.

FIG. 7 shows the output signal of the input/output buffer 301 shown in FIGS. 3 and 4. The reference signal 711 refers to the signal VOUT2 output from the input/output buffer 301 when the reference voltage Vref is equal to the reference value (Va in FIG. 5). When the reference voltage Vref increases above the reference value (Va in FIG. 5), the output signal 721 of the input/output buffer 301 has reduced skew relative to the reference signal 711. When the reference voltage Vref decreases below the reference value (Va in FIG. 5), the output signal 731 of the input/output buffer 301 likewise has reduced skew relative to the reference signal 711. Thus, skew may be decreased compared to the prior art and compared to the output of the amplification portion (311 FIGS. 3 and 4). For example, when the reference voltage Vref is varied, the skew of the output signal Vout of the conventional input/output buffer 101 can range from −107 to +77. However, the skew of an output signal from a buffer according to embodiments of the present invention such as VOUT2 of the input/output buffer 301 may be reduced to the range of −21 to +22. That is, according to certain embodiments of the present invention, the skew may be improved by 75%.

The operation of the input/output buffer 301 shown in FIGS. 3 and 4 will now be described with reference to FIG. 7.

First, a case where a reference voltage Vref is higher than a reference value (Va in FIG. 5) will be described. If the external signal IN is lower than the reference voltage Vref, the output signal VOUT1 of the differential amplification portion 311 is logic high and the output signal VOUT2 of the inverting portion 321 is logic low.

In this state, if the external signal IN increases above the reference voltage Vref, the output signal VOUT1 of the differential amplification portion 311 transitions from logic high to logic low. However, the reference voltage Vref is higher than the reference value (Va in FIG. 5). Thus, the output signal VOUT1 of the differential amplification portion 311 may transition relatively quickly (631) as shown in FIG. 6. As the output signal VOUT1 of the differential amplification portion 311 transitions to logic low, the PMOS transistor PM4 of the inverting portion 321 becomes active and the output signal VOUT2 of the inverting portion 321 is transferred from logic low to logic high.

In such a case, because the reference voltage Vref is higher than the reference value (Va in FIG. 5), the gate-source voltage Vgs of the PMOS transistor PM5 decreases and the quantity of electric charge output from the power source 331 decreases. Accordingly, the time for the output signal VOUT2 of the inverting portion 321 to transition from logic low to logic high is delayed and the resulting output signal 721 may be close to the reference signal 711.

In this state, if the external signal IN decreases below the reference voltage Vref, the output signal VOUT1 of the differential amplification portion 311 transitions from logic low to logic high. However, the reference voltage Vref is higher than the reference value (Va in FIG. 5). Thus, the output signal VOUT1 of the differential amplification portion 311 transistions relatively slowly (632) as shown in FIG. 6. As the output signal VOUT1 of the differential amplification portion 311 transitions to logic high, the NMOS transistor NM3 of the inverting portion 321 becomes active and the output signal VOUT2 of the input/output buffer 301 transitions from logic high to logic low.

Because the reference voltage Vref is higher than the reference value (Va in FIG. 5), the gate-source voltage Vgs of the NMOS transistor NM4 increases and the quantity of electric charge output from the inverting portion 321 to the ground terminal increases. Accordingly, the time for the output signal VOUT2 of the inverting portion 321 to transition from logic high to logic low becomes fast and the output signal 722 closes to the reference signal 711.

Second, a case where a reference voltage Vref decreases below a reference value (Va in FIG. 5) will be described. If the external signal IN is lower than the reference voltage Vref, the output signal VOUT2 of the differential amplification portion 321 is logic high and the output signal VOUT2 of the inverting portion 321 is logic low.

In this state, if the external signal IN increases above the reference voltage Vref, the output signal VOUT1 of the differential amplification portion 311 transitions from logic high to logic low. However, since the reference voltage Vref is lower than the reference value (Va in FIG. 5), the output signal VOUT1 of the differential amplification portion 311 may transition relatively slowly (621) as shown in FIG. 6. As the output signal VOUT1 of the differential amplification portion 311 transitions to logic low, the PMOS transistor PM5 of the inverting portion 321 becomes active and the output signal VOUT2 of the inverting portion 321 transitions from logic low to logic high.

Because the reference voltage Vref is lower than the reference value (Va in FIG. 5), the gate-source voltage Vgs of the PMOS transistor PM5 increases and the quantity of electric charge output from the power supply voltage supply portion 331 increases. Accordingly, the time for the output signal VOUT2 of the inverting portion 321 to be transited from logic low to logic high becomes fast and the resulting output signal 731 may have reduced skew relative to the reference signal 711.

In this state, if the external signal IN decreases below the reference voltage Vref, the output signal VOUT1 of the differential amplification portion 311 transitions from logic low to logic high. However, the reference voltage Vref is lower than the reference value (Va in FIG. 5). Thus, the output signal VOUT1 of the differential amplification portion 311 is transferred relatively quickly (622) as shown in FIG. 6. As the output signal VOUT1 of the differential amplification portion 311 transitions to logic high, the NMOS transistor NM3 of the inverting portion 321 becomes active and the output signal VOUT2 of the input/output buffer 301 transitions from logic high to logic low.

Because the reference voltage Vref is lower than the reference value (Va in FIG. 5), the gate-source voltage Vgs of the NMOS transistor NM4 decreases and the quantity of electric charge output from the inverting portion 321 to the ground terminal decreases. Accordingly, the time for the output signal VOUT2 of the inverting portion 321 to transition from logic high to logic low is delayed and the output signal 732 may have reduced skew relative to the reference signal 711.

As described above, despite variation in the reference voltage Vref, the skew of the output signal VOUT2 of the input/output buffer 301 may be reduced as shown in FIG. 7.

Figure 8:
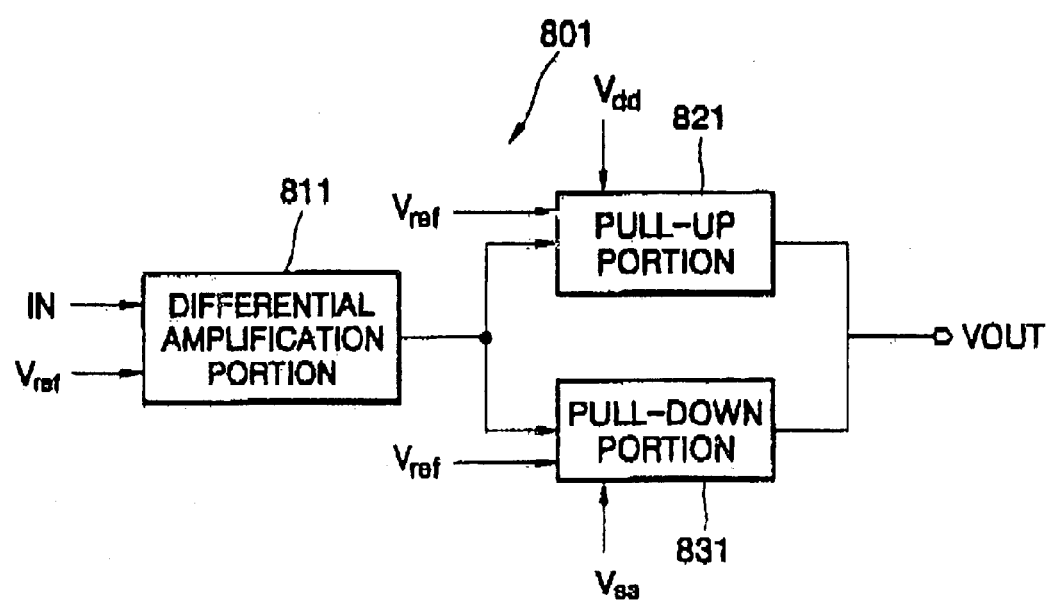
FIG. 8 is a block diagram of a buffer according to further embodiments of the present invention.

FIG. 8 is a circuit diagram of a differential type input/output buffer according to further embodiments of the present invention. Referring to FIG. 8, the differential type input/output buffer 801 includes a differential amplification portion 811, a pull-up portion 821, and a pull-down portion 831.

The differential amplification portion 811 receives an external signal IN and a reference voltage Vref, amplifies the external signal IN and outputs it. That is, if the external signal IN is higher than the reference voltage Vref, the differential amplification portion 811 outputs a ground voltage level signal, and if the external signal IN is lower than the reference voltage Vref, the differential amplification portion 811 outputs a power supply voltage level signal. For example, if the input/output buffer 801 of the present invention is used as an input buffer, the external signal IN may have a voltage of a transistor transistor logic level or a stub series terminated logic level. The power supply voltage may be a CMOS level voltage. In such a case, the TTL or SSTL level external signal IN input to the differential amplification portion 311 can be converted into a CMOS level and output.

If the reference voltage Vref increases above a reference value 511 as shown in FIG. 5, the differential amplification portion 811 outputs signals 631 and 622 faster than the reference signal 611 as shown in FIG. 6. If the reference voltage Vref decreases below the reference value 511, the differential amplification portion 811 outputs signals 621 and 632 slower than the reference signal 611. The differential amplification portion 811 includes a configuration of the differential amplification portion 311 in FIG. 4.

The pull-up portion 821 receives an output signal of the differential amplification portion 811 and a reference voltage Vref. The pull-up portion 821 outputs a power supply voltage level signal Vdd as an output signal VOUT of the input/output buffer 801, if the output signal is logic low.

If the external signal IN becomes higher than the reference voltage Vref in the state where the reference voltage Vref is higher than the reference value (Va in FIG. 5), the output signal of the differential amplification portion 811 transitions from logic high to logic low slower than the reference signal 611. The output signal VOUT of the pull-up portion 821 transitions from logic low to logic high slower than the reference signal 711. Here, the pull-up portion 821 causes the output signal 731 to transition so that it may approach the reference signal 711 and so that it may have reduced skew as shown in FIG. 7.

If the external signal IN becomes higher than the reference voltage Vref in the state where the reference voltage Vref is lower than the reference value (Va in FIG. 5), the output signal of the differential amplification portion 811 may transition from logic high to logic low faster than the reference signal 611. The output signal VOUT of the pull-up portion 821 can transition from logic low to logic high faster than the reference signal 711. Therefore, the pull-up portion 821 causes the output signal 721 to transition so that it may approach the reference signal 711 and so that it may have reduced skew as shown in FIG. 7. The pull-up portion 821 includes the power supply voltage supply portion 331 and the PMOS transistor PM4 in FIG. 4.

The pull-down portion 831 receives an output signal of the differential amplification portion 811 and a reference voltage Vref. The pull-up portion 831 outputs a ground voltage level signal Vss as an output signal VOUT of the input/output buffer 801, if the output signal of the differential amplification portion 811 is logic high.

If the external signal IN becomes lower than the reference voltage Vref in the state where the reference voltage Vref is lower than the reference value (Va in FIG. 5), the output signal of the differential amplification portion 811 may transition from logic low to logic high slower than the reference signal 611. The output signal VOUT of the pull-down portion 831 can transition from logic high to logic low faster than the reference signal 711. Therefore, the pull-down portion 831 causes the output signal 722 to transition so that it may approach the reference signal 711 and so that it may have reduced skew as shown in FIG. 7. The pull-down portion 831 includes the ground voltage supply portion 341 and the NMOS transistor NM3 in FIG. 4.

As described above, even though the reference voltage Vref may vary, the skew in the output signal of the input/output buffer 801 may be reduced as shown in FIG. 7.

According to embodiments of the present invention, even though the reference voltage Vref increases/decreases above/below the reference value 511, skew in the output signal of the input/output buffers 301 and 801 may be reduced as shown in FIG. 7. That is, according to certain embodiments of the invention, the skew may be reduced by 75% compared to the conventional input/output buffer 101. If the skew is decreased, malfunctions in a semiconductor device equipped with the input/output buffers 301 and 801 may be reduced While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A buffer comprising:
    an amplifier that receives an external signal and a reference voltage, and that generates an amplified signal responsive to a difference between the external signal and the reference voltage;
    an inverter that receives the amplified signal and generates an inverted signal responsive to the amplified signal;
    a voltage supply circuit configured to provide an adjusted power supply voltage to the inverter responsive to the reference voltage; and
    a ground voltage supply circuit configured to provide an adjusted ground voltage to the inverter responsive to the reference voltage.

2. The buffer of claim 1, wherein the voltage supply circuit is configured to adjust the power supply voltage downward when the reference voltage exceeds a reference value and to adjust the power supply voltage upward when the reference voltage is lower than the reference value.

3. The buffer of claim 1, wherein the ground voltage supply circuit is configured to adjust the ground voltage upward when the reference voltage exceeds a reference value and to adjust the ground voltage downward when the reference value is lower than the reference value.

4. The buffer of claim 1, wherein the amplifier is configured to receive a ground voltage and a power supply voltage, wherein the amplifier outputs the ground voltage when the external signal is greater than the reference voltage and the power supply voltage when the external signal is less than the reference voltage.

5. The buffer of claim 4, wherein the voltage supply circuit receives the power supply voltage and adjusts the power supply voltage responsive to the reference voltage.

6. The buffer of claim 4, wherein the ground voltage supply circuit receives the ground voltage and adjusts the ground voltage responsive to the reference voltage.

7. The buffer of claim 4, wherein the voltage supply circuit receives the power supply voltage and the voltage supply circuit comprises a transistor between the power supply voltage and the inverter.

8. The buffer of claim 7, wherein the transistor has a gate coupled to the reference voltage.

9. The buffer of claim 8, wherein the transistor has a source coupled to the power supply voltage and a drain coupled to the inverter.

10. The buffer of claim 9, wherein the transistor is a first transistor and wherein the voltage supply circuit further comprises a second transistor in parallel with the first transistor between the power supply voltage and the inverter, the second transistor having a gate coupled to the ground voltage.

11. The buffer of claim 10, wherein the first and second transistors are PMOS transistors.

12. The buffer of claim 4, wherein the ground voltage supply circuit receives the ground voltage and comprises a transistor between the ground voltage and the inverter.

13. The buffer of claim 12, wherein the transistor has a gate coupled to the reference voltage.

14. The buffer of claim 13, wherein the transistor has a source coupled to the ground voltage and a drain coupled to the inverter.

15. The buffer of claim 14, wherein the transistor is a first transistor and wherein the ground supply circuit further comprises a second transistor in parallel with the first transistor between the ground voltage and the inverter, the second transistor having a gate coupled to the power supply voltage.

16. The buffer of claim 15, wherein the first and the second transistors are NMOS transistors.

17. The buffer of claim 4, wherein the inverter comprises:
    a first transistor coupled in series with a second transistor between the power supply voltage circuit and the ground voltage supply circuit.

18. The buffer of claim 17, wherein the first and second transistors each have a source, a gate and a drain; the gates of the first and second transistors being coupled at a common node to the output of the amplifier; the drain of the first transistor and the source of the second transistor being coupled to a common voltage output node; the source of the first transistor being coupled to the voltage supply circuit; and the source of the second transistor being couple to the ground voltage supply circuit.

19. The buffer of claim 18, wherein the first transistor is a PMOS transistor and the second transistor is an NMOS transistor.

20. The buffer of claim 1, wherein the amplifier further comprises:
    a first NMOS transistor having a source coupled to a ground voltage, a gate coupled to the reference voltage, and a drain;
    a second NMOS transistor having a source coupled to the ground voltage, a gate coupled to the external signal, and a drain; and
    a current mirror coupled to the drains of the first and second NMOS transistors and having an input coupled to a power supply voltage.

21. A method of reducing skew in a buffer including an amplifier that receives an external signal and a reference signal and that generates an amplified signal responsive to a difference between the external signal and the reference signal, and an inverter that receives the amplified signal and generates an inverted signal responsive to the amplified signal, the method comprising:
    adjusting a power supply voltage provided to the inverter responsive to the reference voltage; and
    adjusting a ground voltage supply provided to the inverter responsive to the reference voltage.

22. The method of claim 21, wherein the step of adjusting the power supply voltage further comprises: adjusting the power supply voltage downward when a reference voltage exceeds the reference value and adjusting the power supply voltage upward when the reference voltage is lower than the reference value.

23. The method of claim 21, wherein the step of adjusting the ground voltage further comprises: adjusting the ground voltage upward when the reference voltage exceeds a reference value and adjusting the ground voltage downward when the reference value is lower than the reference value.

24. A buffer comprising:
an amplifier that receives an external signal and a reference signal and that generates an amplified signal responsive to a difference between the external signal and the reference signal;
an inverter that receives the amplified signal and generates an inverted signal responsive to the amplified signal;
a voltage supply circuit comprising a first transistor coupled in series between a power supply voltage and the inverter with a control electrode of the first transistor being coupled with the reference voltage; and
a second transistor coupled in parallel with the first transistor between the power supply voltage and the inverter wherein a control electrode of the second transistor is coupled to a ground voltage.

25. A buffer according to claim 24, wherein the first and second transistors comprise PMOS transistors.

26. A buffer comprising:
an amplifier that receives an external signal and a reference signal and that generates an amplified signal responsive to a difference between the external signal and the reference signal;
an inverter that receives the amplified signal and generates an inverted signal responsive to the amplified signal;
a voltage supply circuit comprising a first transistor coupled in series between a power supply voltage and the inverter with a control electrode of the first transistor being coupled with the reference voltage; and
a ground supply circuit comprising a second transistor coupled in series between a ground voltage and the inverter with a control electrode of the second transistor being coupled to the reference voltage.

27. A buffer comprising:
an amplifier that receives an external signal and a reference signal and that generates an amplified signal responsive to a difference between the external signal and the reference signal;
an inverter that receives the amplified signal and generates an inverted signal responsive to the amplified signal;
a ground supply circuit comprising a first transistor coupled in series between a ground voltage and the inverter with a control electrode of the first transistor being coupled to the reference voltage; and
a second transistor coupled in parallel with the first transistor between the ground voltage and the inverter wherein a control electrode of the second transistor is coupled to a power supply voltage.

28. A buffer according to claim 27, wherein the first and second transistors comprise NMOS transistors.

29. A buffer comprising:
an amplifier that receives an external signal and a reference signal and that generates an amplified signal responsive to a difference between the external signal and the reference signal;
an inverter that receives the amplified signal and generates an inverted signal responsive to the amplified signal;
a ground supply circuit comprising a first transistor coupled in series between a around voltage and the inverter with a control electrode of the first transistor being coupled to the reference voltage; and
a voltage supply circuit comprising a second transistor coupled in series between a power supply voltage and the inverter with a control electrode of the second transistor being coupled with the reference voltage.

30. A differential type input/output buffer comprising:
a differential amplification portion which receives an external signal and a reference voltage, amplifies the external signal and outputs the amplified signal;
an inverting portion which inverts the output of the differential amplification portion and outputs the inverted signal;
a power source which provides a power supply voltage to the inverting portion, and varies the quantity of electric charge provided to the inverting portion in response to the reference voltage; and
a ground voltage supply portion which provides a ground voltage to the inverting portion, and varies the quantity of electric charge provided to the inverting portion in response to the reference voltage.

31. The differential type input/output buffer of claim 30, wherein when the reference voltage increases above the reference value, the quantity of electric charge provided by the power source to the inverting portion decreases, rising time of the output signal of the inverting portion becomes slow, the quantity of electric charge of the ground voltage provided to the inverting portion increases and the falling time of the output signal of the inverting portion becomes fast.

32. The differential type input/output buffer of claim 30, wherein when the reference voltage decreases below the reference value, the quantity of electric charge provided by the power source to the inverting portion increases, the rising time of the output signal of the inverting portion becomes fast, the quantity of electric charge of the ground voltage provided to the inverting portion decreases and the falling time of the output signal of the inverting portion becomes slow.

33. The input/output buffer of differential type of claim 30, wherein the power source supply portion comprises:
a first PMOS transistor having a source to which the power supply voltage is applied, a gate to which the reference voltage is applied, and a drain connected to the inverting portion; and
a second PMOS transistor having a source to which the power supply voltage is applied, a gate to which the ground voltage is applied, and a drain connected to the inverting portion.

34. The differential type input/output buffer of claim 30, wherein the ground voltage supply portion comprises:
a first NMOS transistor having a drain connected to the inverting portion, a gate to which the reference voltage is applied, and a source to which the ground voltage is applied; and
a second NMOS transistor having a drain connected to the inverting portion, a gate to which the power supply voltage is applied, and a source to which the ground voltage is applied.

* * * * *

UNITED STATES PATENT AND TRADEMARK OFFICE
CERTIFICATE OF CORRECTION

PATENT NO.    : 6,777,985 B2
DATED         : August 17, 2004
INVENTOR(S)   : Moon et al.

It is certified that error appears in the above-identified patent and that said Letters Patent is hereby corrected as shown below:

Column 11,
Line 65, should read -- coupled in series between ground voltage and the --

Signed and Sealed this

Thirty-first Day of May, 2005

JON W. DUDAS
*Director of the United States Patent and Trademark Office*